United States Patent
Seo et al.

(10) Patent No.: US 7,153,733 B2
(45) Date of Patent: Dec. 26, 2006

(54) METHOD OF FABRICATING FIN FIELD EFFECT TRANSISTOR USING ISOTROPIC ETCHING TECHNIQUE

(75) Inventors: Hyeoung-Won Seo, Gyeonggi-do (KR); Woun-Suck Yang, Gyeonggi-do (KR); Du-Heon Song, Gyeonggi-do (KR); Jae-Man Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 11/083,660

(22) Filed: Mar. 16, 2005

(65) Prior Publication Data

US 2005/0208715 A1    Sep. 22, 2005

(30) Foreign Application Priority Data

Mar. 17, 2004   (KR) .................. 10-2004-0018122

(51) Int. Cl.
*H01L 21/336* (2006.01)
*H01L 21/8234* (2006.01)
*H01L 21/331* (2006.01)

(52) U.S. Cl. .............. 438/197; 438/258; 438/298; 438/359

(58) Field of Classification Search ............... 438/197, 438/258, 298, 359, 296, 268, 254, 294
See application file for complete search history.

(56) References Cited

U.S. PATENT DOCUMENTS

| | | | | |
|---|---|---|---|---|
| 4,946,799 A | * | 8/1990 | Blake et al. ............... | 438/154 |
| 5,739,057 A | * | 4/1998 | Tiwari et al. ............... | 438/172 |
| 6,174,794 B1 | * | 1/2001 | Gardner et al. ............. | 438/595 |
| 6,222,234 B1 | * | 4/2001 | Imai ............................. | 257/347 |
| 6,689,650 B1 | | 2/2004 | Gambino et al. | |
| 6,838,322 B1 | * | 1/2005 | Pham et al. ................. | 438/151 |
| 7,005,330 B1 | * | 2/2006 | Yeo et al. .................... | 438/157 |

FOREIGN PATENT DOCUMENTS

| | | |
|---|---|---|
| JP | 2002-151688 | 5/2002 |
| KR | 2001-0048716 | 6/2001 |

OTHER PUBLICATIONS

English language abstract of Japanese Publication No. 2002-151688.
English language abstract of Korean Publication No. 2001-0048716.

* cited by examiner

*Primary Examiner*—Chuong Anh Luu
(74) *Attorney, Agent, or Firm*—Marger Johnson & McCollom, P.C.

(57) ABSTRACT

Methods of fabricating a fin field effect transistor (FinFET) are disclosed. Embodiments of the invention provide methods of fabricating FinFETs by optimizing a method for forming the fin so that a short channel effect is prevented and high integration is achieved. Accordingly, the fin which has a difficulty in its formation using the current photolithography-etching technique may be readily formed.

11 Claims, 15 Drawing Sheets

METHOD OF FABRICATING FIN FIELD EFFECT TRANSISTOR USING ISOTROPIC ETCHING TECHNIQUE

CROSS-REFERENCE TO RELATED APPLICATION

This application claims the benefit of Korean Patent Application No. 2004-18122, filed Mar. 17, 2004, the contents of which are hereby incorporated herein by reference in their entirety.

BACKGROUND OF THE INVENTION

1. Field of the Invention

The present invention relates to a method of fabricating a semiconductor device and, more particularly, to a method of fabricating a fin field effect transistor (FinFET) using an isotropic etching technique.

2. Description of Related Art

Semiconductor devices widely employ discrete devices such as Metal Oxide Semiconductor (MOS) transistors as switching devices. As integration of the semiconductor device increases, the sizes of MOS transistors are scaled down. As a result, the channel length of the MOS transistor is reduced so that a short channel effect may easily occur.

In general, methods for highly doping channel ions within a channel region are used to prevent a threshold voltage from decreasing due to the short channel effect. However, when the channel region is highly doped, channel resistance increases to thereby reduce current driving capability. In addition, the concentration increase of the channel ions leads to an increase of an electric field between the channel region, and source and drain regions. As a result, leakage current increases between the channel region, and the source and drain regions. In particular, when a capacitor for storing charges, as in a DRAM cell, is connected to the source or drain region, the increase of the leakage current leads to deterioration of the charge retention characteristics.

Accordingly, research is widely conducted with respect to a three dimensional transistor to reduce the short channel effect. In particular, research is widely conducted with respect to a FinFET having good on-off characteristics because of its narrow channel width.

U.S. Pat. No. 6,689,650 discloses a method of fabricating the FinFET entitled "Fin Field Effect Transistor with Self-Aligned Gate", to Gambino et al.

According to the method disclosed by Gambino et al, it has an advantage that resistance between a channel region, and source and drain regions may be reduced because a self-aligned gate may be formed in the fin. According to the method disclosed by Gambino et al, a hard mask is patterned using a typical photolithography-etching technique to form the fin. However, there exists a limitation to form the hard mask pattern having a narrow width by patterning the hard mask, using the photolithography-etching technique.

As a result, a method for forming the fin having a narrow width needs to be optimized.

SUMMARY OF THE INVENTION

Embodiments of the invention provide methods of fabricating FinFETs by optimizing a method for forming the fin so that a short channel effect is prevented and high integration is achieved.

In one embodiment, the invention is directed to a method of fabricating a FinFET. The method includes forming a hard mask pattern on a semiconductor substrate. The hard mask pattern includes a lower hard mask pattern and an upper hard mask pattern. The semiconductor substrate is etched, using the hard mask pattern as an etching mask, to form a trench for defining an active region. The sidewalls of the lower hard mask pattern is then recessed. An isolation layer is then formed to fill the trench and cover sidewalls of the lower hard mask pattern. In this case, the upper hard mask pattern is removed to expose an upper surface of the recessed lower hard mask pattern. A predetermined region of the active region is then removed by etching using the recessed lower hard mask pattern as an etching mask to form the fin. The lower hard mask pattern is then removed to expose an upper surface of the fin, and a gate electrode is formed to cover the exposed upper surface and sidewalls of the fin. In this case, the gate electrode is insulated from the fin. According to embodiments of the present invention, the lower hard mask pattern is recessed using, for example, the isotropic etching technique, to form the recessed lower hard mask pattern. Accordingly, the fin having a narrow width may be patterned to overcome the limitation of current photolithography-etching technique.

In another embodiment, a channel stopping region may be formed by implanting channel ions into the semiconductor substrate before forming the hard mask pattern. The channel stopping region may be formed to define the channel within the fin.

In yet another embodiment, the hard mask pattern may further include a pad oxide layer. The pad oxide layer is employed to reduce the stress between the lower hard mask pattern and the semiconductor substrate.

In still another embodiment, forming the isolation layer may include forming an insulating layer on the semiconductor substrate having the recessed lower hard mask pattern. The insulating layer may be planarized until the upper surface of the recessed lower hard mask pattern is exposed.

In one aspect of the present invention, the isolation layer may be selectively recessed to expose the upper surface of the active region after the isolation layer is formed. As a result, the upper surface of the active region is exposed except the lower region of the recessed lower hard mask pattern.

In another aspect, a photoresist pattern having a groove extending across the recessed lower hard mask pattern may be formed on the semiconductor substrate having the isolation layer before etching the predetermined region of the active region. The predetermined region of the active region is etched using the photoresist pattern and the recessed lower hard mask pattern as an etching mask. After the predetermined region of the active region is etched, the photoresist pattern is removed.

In another embodiment, the invention is directed to a method of fabricating a FinFET. This method includes forming a hard mask pattern on a semiconductor substrate. The semiconductor substrate is etched, using the hard mask pattern as an etching mask, to form a trench for defining an active region. An isolation layer is then formed to fill the trench and cover sidewalls of the hard mask pattern. A photoresist pattern is then formed to have a groove extending across the hard mask pattern. The isolation layer is etched, using the photoresist pattern and the hard mask pattern, as an etching mask to expose both sidewalls of the active region, and the photoresist pattern is removed. The sidewalls of the exposed active region are then recessed using, for example, the isotropic etching technique to form a fin, and the hard mask pattern is removed to expose an upper surface of the fin. A gate electrode is then formed to cover the exposed upper surface and sidewalls of the fin. In this case, the gate electrode is insulated from the fin. According to another embodiment of the present invention, the active region may be recessed, using the isotropic etching technique, to form the fin and simplify the process.

In one embodiment, a channel stopping region may be formed by implanting channel ions into the semiconductor substrate before forming the hard mask pattern.

In another embodiment, the hard mask pattern may include a lower hard mask pattern and an upper hard mask pattern which are sequentially stacked, and may further include a pad oxide layer.

In yet another embodiment, forming the isolation layer may include forming an insulating layer on the semiconductor substrate having the hard mask pattern. The insulating layer may be planarized until the upper surface of the lower hard mask pattern is exposed.

In still another embodiment, the isolation layer may be selectively recessed after the isolation layer is formed. In this case, the isolation layer may be recessed on the almost same level as the active region of the semiconductor substrate. Accordingly, it is easy to form the gate electrode using the photolithography-etching technique.

BRIEF DESCRIPTION OF THE DRAWINGS

The foregoing and other objects, features and advantages of the invention will be apparent from the more particular description of an exemplary embodiment of the invention, as illustrated in the accompanying drawings. The drawings are not necessarily drawn to scale, emphasis instead being placed upon illustrating the principles of the invention.

DETAILED DESCRIPTION OF THE PREFERRED EMBODIMENTS

Figure 1:
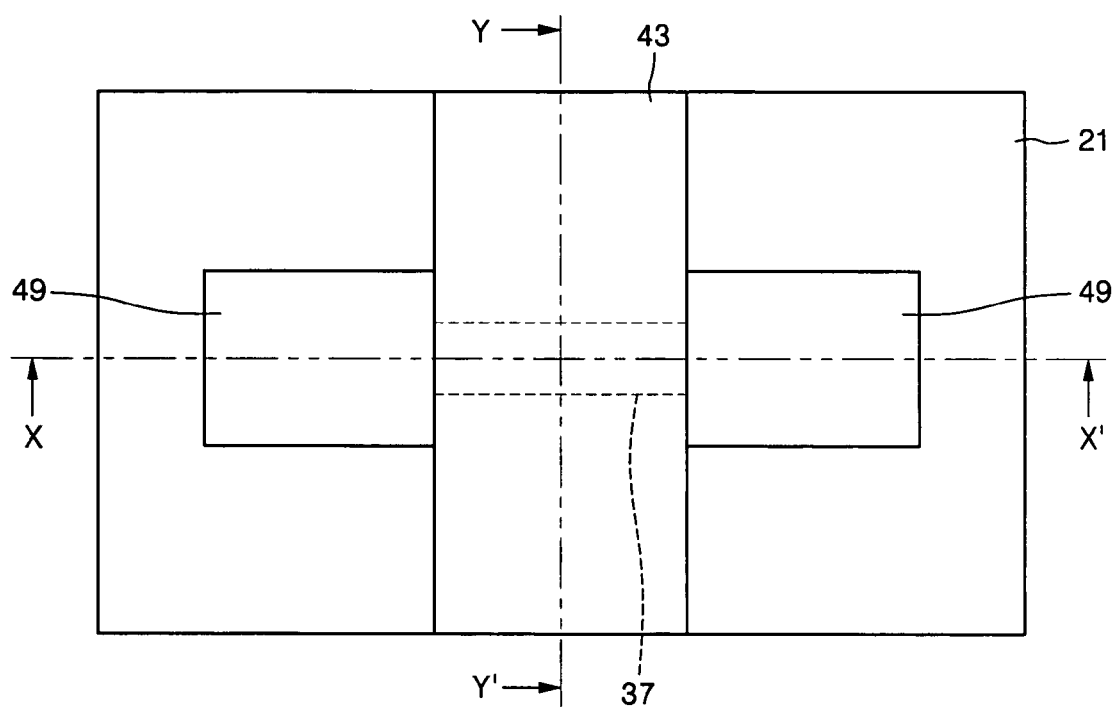
FIG. 1 is a layout illustrating a method of fabricating the FinFET in accordance with embodiments of the present invention.

The present invention will now be described more fully hereinafter with reference to the accompanying drawings, in which exemplary embodiments of the invention are shown. In the drawings, the thickness of the layers and regions are exaggerated for clarity.

FIG. 1 is a layout illustrating a method of fabricating the FinFET in accordance with embodiments of the present invention, and FIG. 2A to FIG. 9B are cross-sectional views, taken along lines X–X' and Y–Y' of FIG. 1, illustrating a method of fabricating the FinFET in accordance with exemplary embodiments of the present invention. In FIG. 2A to FIG. 9B, alphabetical reference "A" indicates cross-sectional views taken along line X–X' of FIG. 1, and "B" indicates cross-sectional views taken along line Y–Y' of FIG. 1.

Figure 2A:
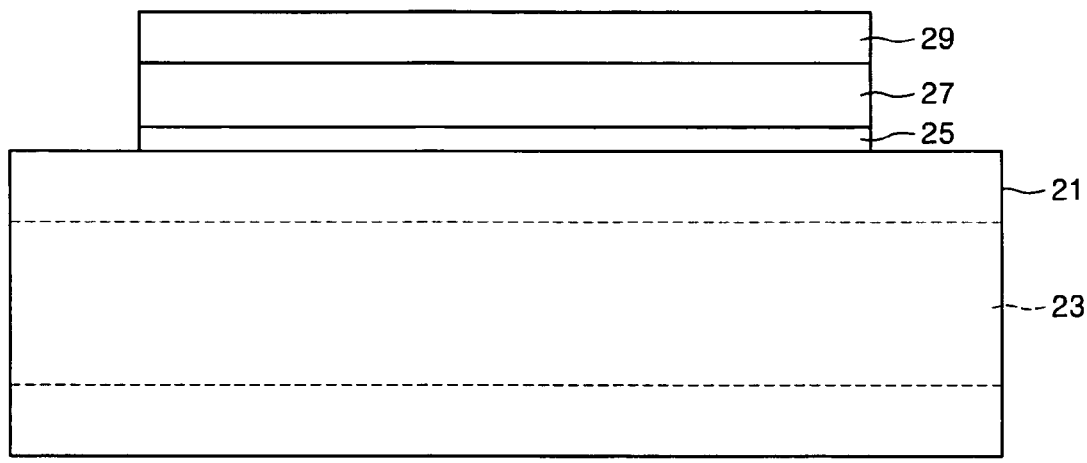
FIG. 2A to FIG. 9B are cross-sectional views, taken along lines X–X' and Y–Y' of FIG. 1, illustrating a method of fabricating the FinFET in accordance with exemplary embodiments of the present invention.
Figure 2B:
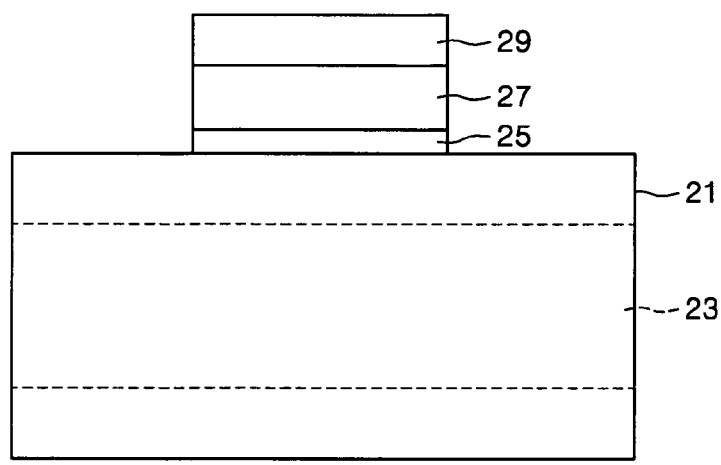

Referring to FIGS. 1, 2A, and 2B, a hard mask pattern is formed on a semiconductor substrate 21. The semiconductor substrate 21 may be a P type silicon substrate. In this case, a channel stopping region 23 may be formed by implanting channel ions into the semiconductor substrate 21 before forming the hard mask pattern. In a case of NMOS transistor, P type channel ions are implanted to form the channel stopping region 23. On the contrary, in the case of PMOS transistor, N type channel ions are implanted to form the channel stopping region 23. The channel stopping region 23 may be formed to prevent a channel from being formed in regions except the channel region. Alternatively, the channel stopping region 23 may be formed to adjust a threshold voltage. On the contrary, the semiconductor substrate 21 may be a silicon-on-insulator (SOI) substrate. When the semiconductor substrate 21 is the SOI substrate, a numerical reference 23 instead indicates an insulator.

The hard mask pattern includes a lower hard mask pattern 27 and an upper hard mask pattern 29 which are sequentially stacked. The lower hard mask pattern 27 is formed of a material layer having an etch selectivity relative to the semiconductor substrate 21. Preferably, the lower hard mask pattern 27 may be a silicon nitride (SiN) layer. In addition, the upper hard mask pattern 29 is a material layer having an etch selectivity relative to the lower hard mask pattern 27. The upper hard mask pattern 29 may be an anti-reflective coating layer (ARC). In addition, the hard mask pattern may further include a pad oxide layer 25 interposed between the lower hard mask pattern 27 and the semiconductor substrate 21. The pad oxide layer 25 may be formed by oxidizing the semiconductor substrate 21 using a thermal oxidation process. The pad oxide layer 25 reduces the stress between the lower hard mask pattern 27 and the semiconductor substrate 21.

The hard mask pattern may be formed by sequentially forming the pad oxide layer 25, the lower hard mask layer 27, and the upper hard mask layer 29, and patterning them using photolithographic and etching processes.

Figure 3A:
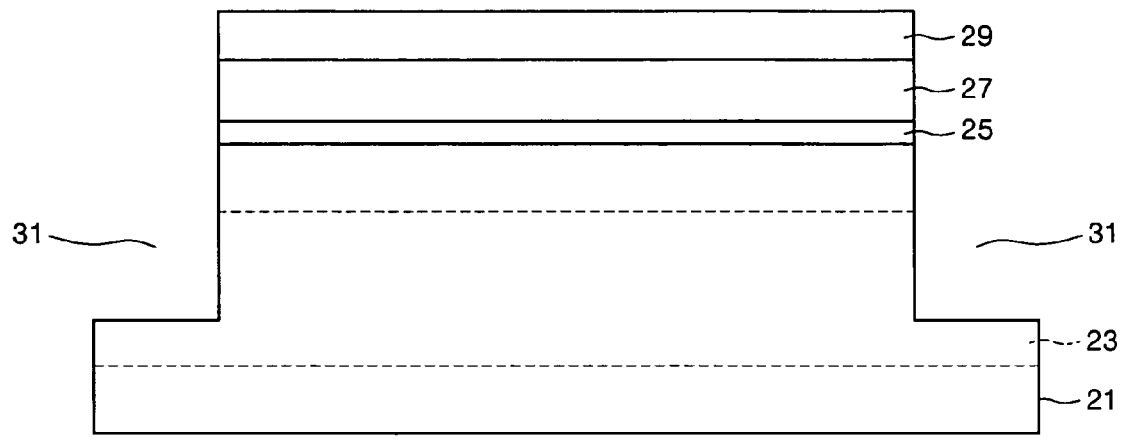
Figure 3B:
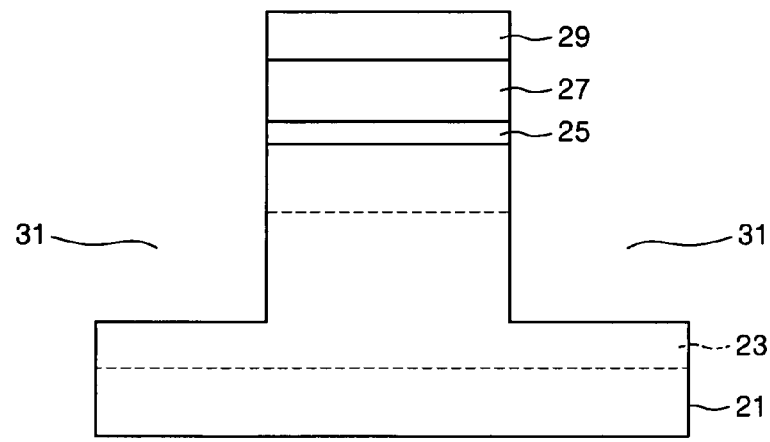

Referring to FIGS. 1, 3A, and 3B, the semiconductor substrate 21 is etched, using the upper and lower hard mask patterns 29 and 27 as an etching mask, to form a trench 31 for defining an active region. In this case, some portion of the channel stopping region 23 may be etched together with the semiconductor substrate 21.

Figure 4A:
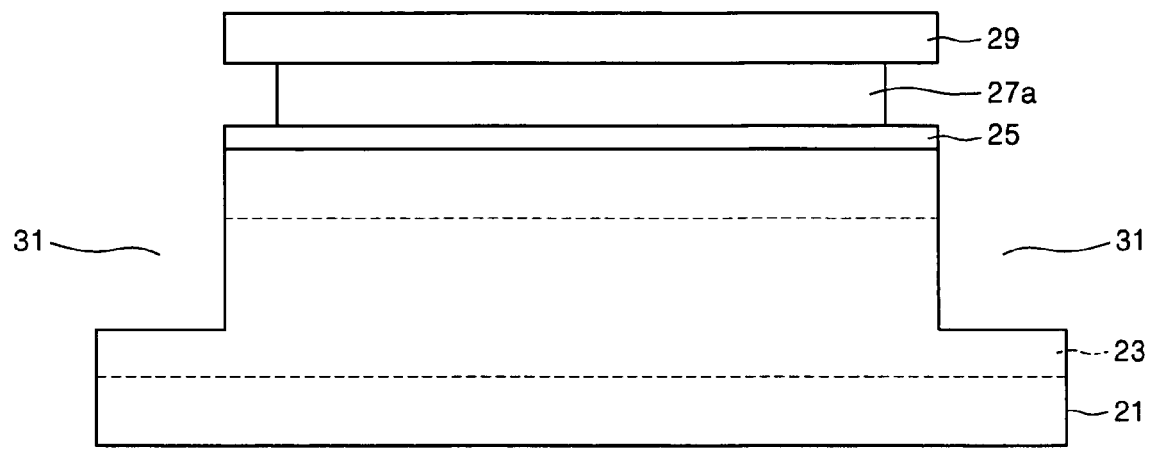
Figure 4B:
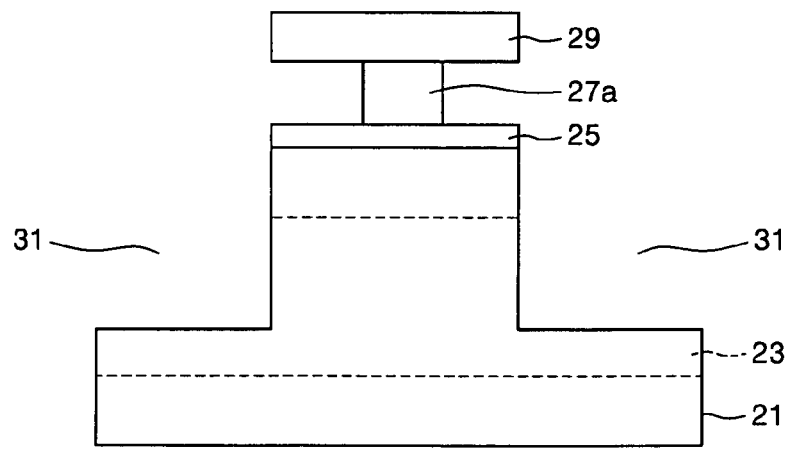

Referring to FIGS. 1, 4A, and 4B, the lower hard mask pattern 27 is etched using an isotropic etching technique after the trench 31 is formed. The isotropic etching process may be performed using a wet or dry etching technique. The isotropic etching process may be preferably performed using an etchant capable of selectively etching the lower hard mask pattern 27. In this case, the upper hard mask pattern 29 prevents an upper surface of the lower hard mask pattern 27 from being etched. As a result, sidewalls of the lower hard mask pattern 27 are recessed to form a recessed lower hard mask pattern 27a. Preferably, the recessed lower hard mask pattern 27a may have a width ranging from about 10 angstroms to about 900 angstroms.

Figure 5A:
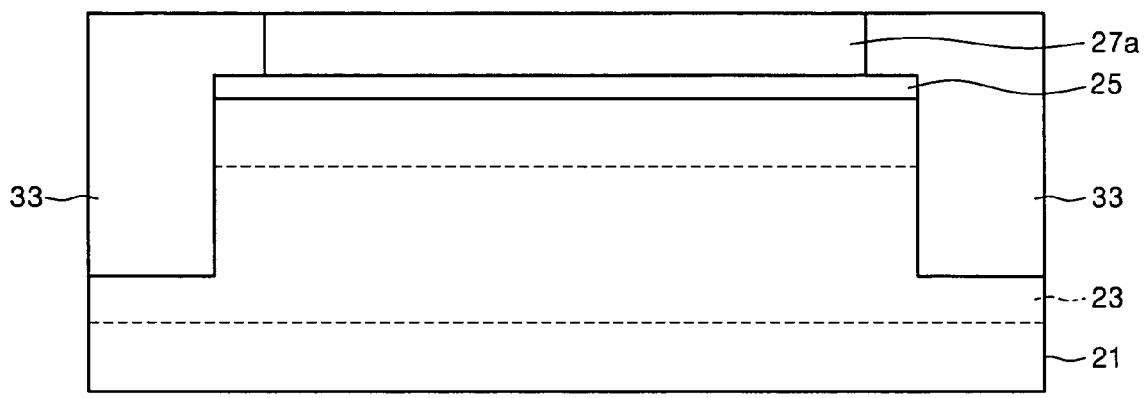
Figure 5B:
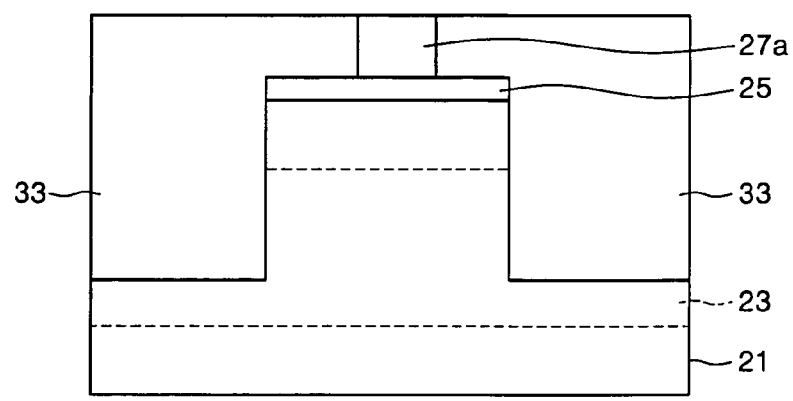

Referring to FIGS. 1, 5A, and 5B, an insulating layer is formed on the semiconductor substrate 21 having the recessed lower hard mask pattern 27a. The insulating layer may be a silicon oxide layer. The insulating layer is formed to fill the trench 31 and cover the sidewalls of the lower hard mask pattern 27a. The insulating layer is then planarized until the upper surface of the lower hard mask pattern 27a is exposed to form an isolation layer 33. In this case, the upper hard mask pattern 29 is removed together with a portion of the insulation layer.

On the contrary, the upper hard mask pattern 29 may be removed before forming the insulating layer. The insulating layer is then formed and planarized until the recessed lower hard mask pattern 27a is exposed to form the isolation layer 33.

Figure 6A:
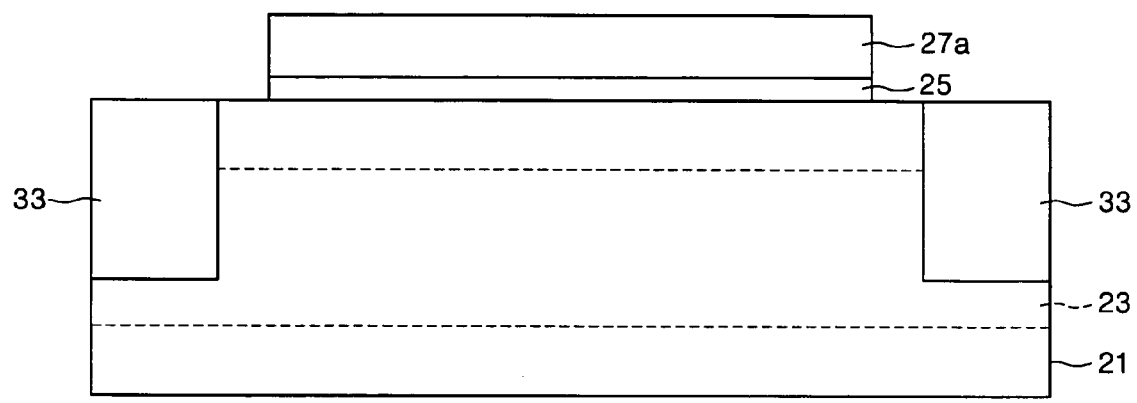
Figure 6B:
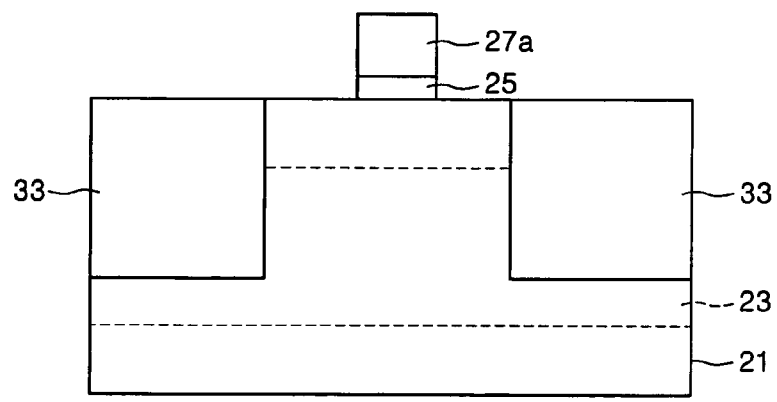

Referring to FIGS. 1, 6A, and 6B, the isolation layer 33 is recessed to have a decreased level. Preferably, the isolation layer 33 is recessed until the upper surface of the semiconductor substrate 21 is exposed. In other words, an upper portion of the isolation layer 33 is removed using conventional techniques. In this case, some portion of the pad oxide layer 25 may be removed. As a result, an active region adjacent to the recessed lower hard mask pattern 27a is exposed. The process of recessing the isolation layer 33 is performed to have almost the same level as the active region of the semiconductor substrate 21 by adjusting the level of the isolation layer 33. Accordingly, the process of recessing the isolation layer 33 may be omitted in this step.

Figure 7A:
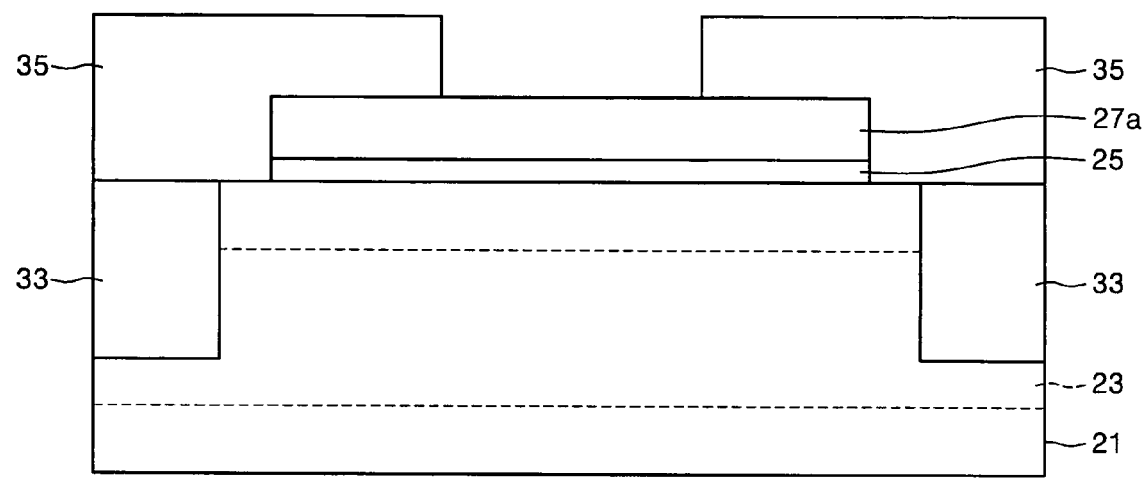
Figure 7B:
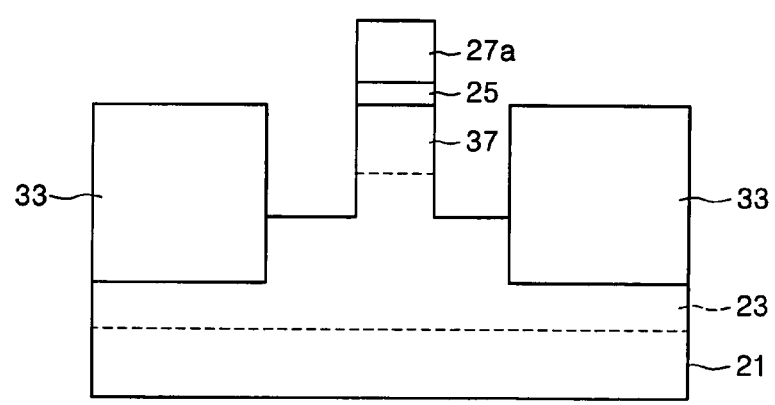

Referring to FIGS. 1, 7A, and 7B, a photoresist 35 having a groove extending across the recessed lower hard mask pattern 27a is formed on the semiconductor substrate 21 having the isolation layer 33. The upper surface of the recessed lower hard mask pattern 27a and the active region adjacent to the recessed lower hard mask pattern 27a are exposed through the groove. In addition, the isolation layer 33 adjacent to the active region may be exposed. The active region is etched using the photoresist pattern 35 and the recessed lower hard mask pattern 27a as an etching mask. As a result, a fin 37 having a narrow width is formed.

When the process of recessing the isolation layer 33 is omitted, the active region adjacent to the lower hard mask pattern 27a is prevented from being exposed by the isolation layer 33. In this case, the isolation layer 33 is recessed until the active region is exposed using the photoresist pattern 35 as an etching mask. As a result, a groove for exposing the active region is formed within the isolation layer 33. The exposed active region is then etched to form the fin 37.

Figure 8A:
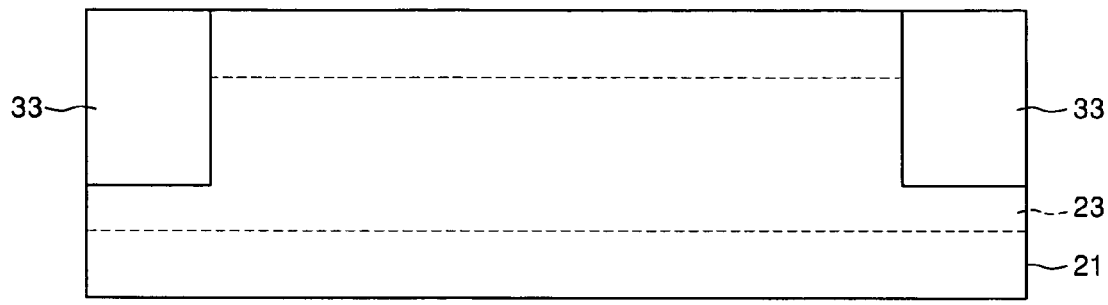
Figure 8B:
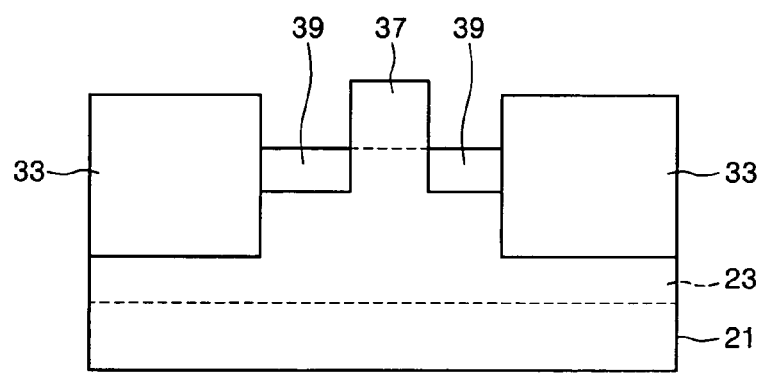

Referring to FIGS. 1, 8A, and 8B, after the fin 37 is formed, the photoresist pattern 35, the recessed lower hard mask pattern 27a, and the pad oxide layer 25 are removed to expose the active region of the semiconductor substrate 21. The recessed lower hard mask pattern 27a and the pad oxide layer 25 may be removed using a wet etching process. In this case, an upper surface of the fin 37 is exposed. A gap filling layer is formed to fill an empty space between the fin 37 and the isolation layer 33 and is recessed to form a channel stopping layer 39.

On the contrary, the channel stopping layer 39 may be formed before removing the recessed lower hard mask pattern 27a. In other words, after the photoresist pattern 35 is removed, the gap filling layer is formed to fill the empty space between the fin 37 and the isolation layer 33. The gap filling layer is then blanket etched to form the channel stopping layer 39, and the recessed lower hard mask pattern 27a and the pad oxide layer 25 are removed.

The channel stopping layer 39 prevents the channel from being formed in an active region adjacent to the fin 37. Accordingly, when the channel is prevented from being formed in the active region adjacent to the fin 37 because of a high ion concentration of the channel stopping region 23, the process of forming the channel stopping layer 39 may be omitted. Alternatively, the process of forming the channel stopping layer 39 may be omitted for the purpose of forming the channel in the active region adjacent to the fin 37.

Figure 9A:
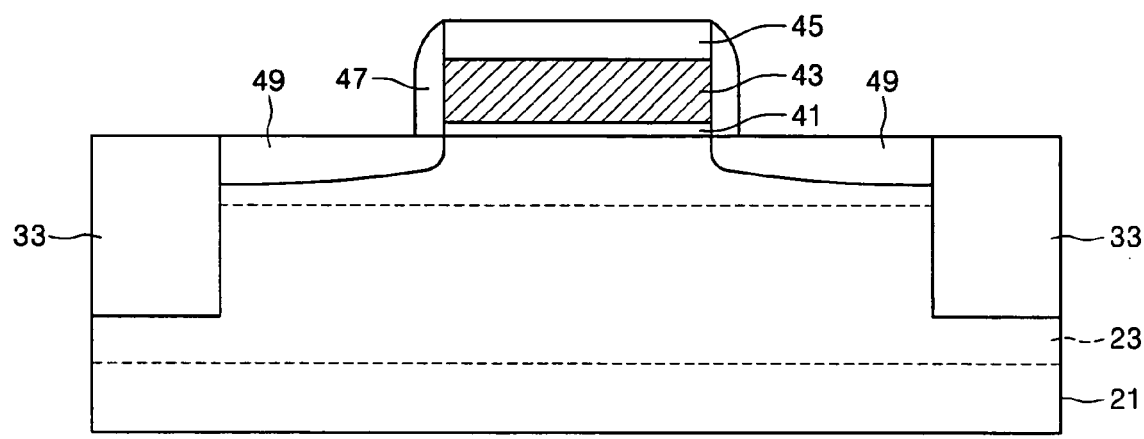
Figure 9B:
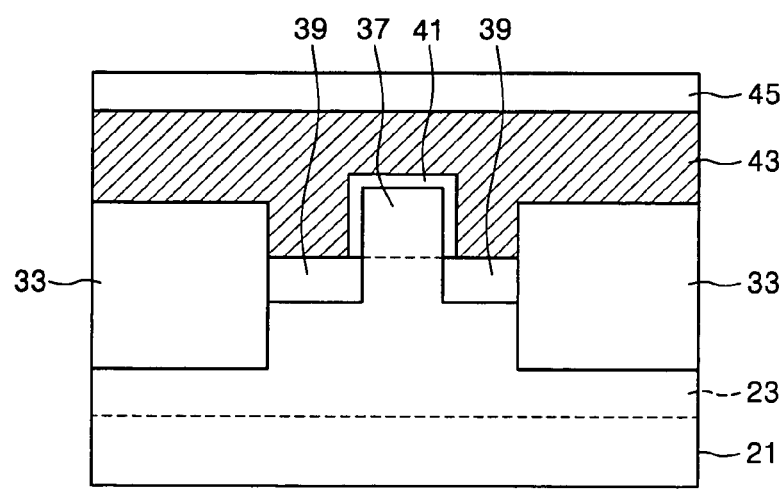

Referring to FIGS. 1, 9A, and 9B, a gate insulating layer 41 is formed on the semiconductor substrate 21 having the channel stopping layer 39. Preferably, the gate insulating layer 41 may be formed by thermally oxidizing the semiconductor substrate 21. As a result, the gate insulating layer 41 is formed on the upper surface and sidewalls of the fin 37. If forming the channel stopping layer 39 is omitted, the gate insulating layer 41 is also formed on the upper surface of the active region adjacent to the fin 37.

A gate conductive layer and a gate hard mask layer are sequentially formed on the semiconductor substrate having the gate insulating layer 41. The gate conductive layer may be formed by stacking polysilicon and metal layers. In addition, the gate hard mask layer may be formed of silicon nitride. The gate conductive layer covers the upper surface and sidewalls of the fin 37. The gate hard mask layer and the gate conductive layer are then patterned to form a gate hard mask pattern 45 and a gate electrode 43. The gate electrode 43 covers the sidewalls of the fin 37.

Impurity ions are implanted, using the gate hard mask pattern 45 as an ion implantation mask, to form source and drain regions 49. Preferably, spacers 47 may be formed on sidewalls of the gate hard mask pattern 45 and the gate electrode 43. These spacers 47 may be formed of silicon nitride, or may be formed by stacking a silicon oxide layer and a silicon nitride layer. An interlayer insulating layer (not shown) may be formed on the semiconductor substrate 21 having the source and drain regions 49, and source and drain contacts (not shown) may be formed which penetrate the interlayer insulating layer and electrically contact the source and drain regions 49.

According to embodiments of the present invention, the lower hard mask pattern 27 is recessed using the isotropic etching technique to form the recessed lower hard mask pattern 27a. The active region is then etched using the recessed lower hard mask pattern 27a as an etching mask to thereby form the fin 37 having a narrow width. Accordingly, the fin which has a difficulty in its formation using the photolithography-etching technique may be readily formed.

FIG. 10A to FIG. 15B are cross-sectional views illustrating a method of fabricating the FinFET in accordance with another embodiment of the present invention.

Figure 10A:
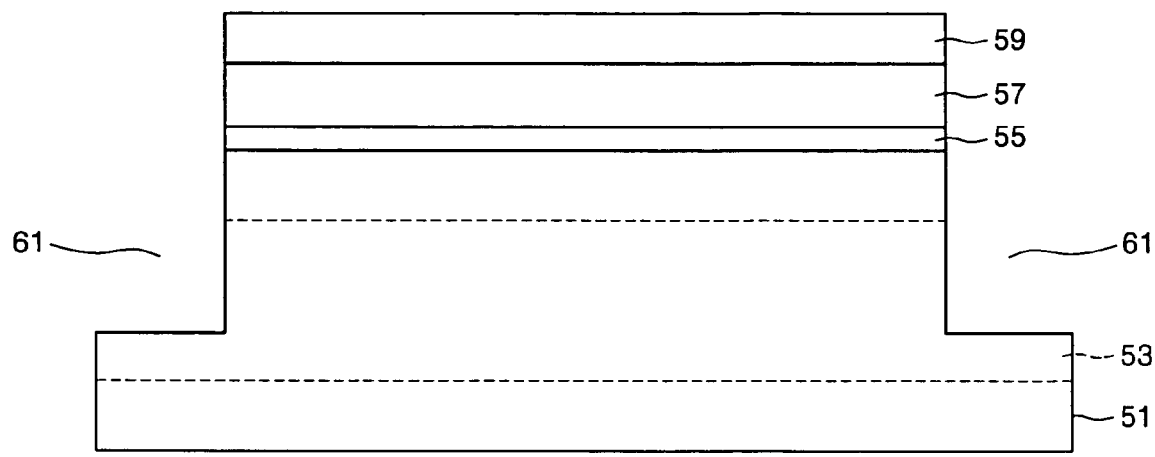
FIG. 10A to FIG. 15B are cross-sectional views illustrating a method of fabricating the FinFET in accordance with other embodiments of the present invention.
Figure 10B:
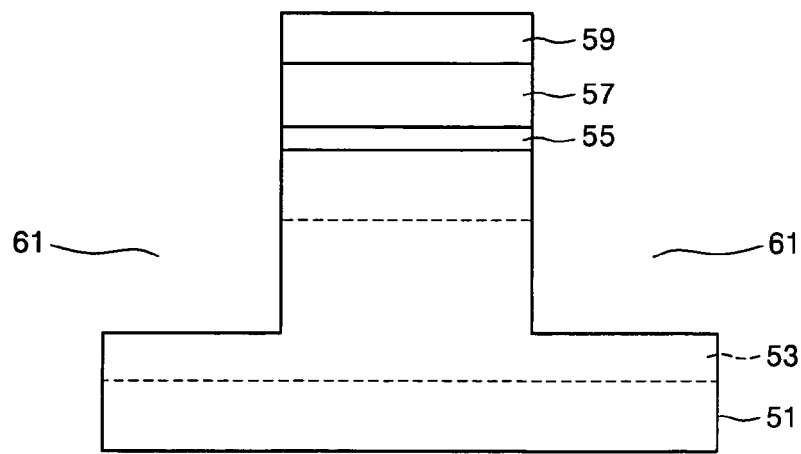

Referring to FIGS. 10A and 10B, as described with reference to FIGS. 2A to 3B, a hard mask pattern is formed on a semiconductor substrate 51. Then, the semiconductor substrate 51 is etched to form a trench 61. In addition, as described with reference to FIGS. 2A and 2B, a channel stopping region 53 may be formed. When the semiconductor substrate 51 is an SOI substrate, a numerical reference 53 indicates an insulator.

The hard mask pattern may include a lower hard mask pattern 57 and an upper hard mask pattern 59, and may further include a pad oxide layer 55. However, the process of forming the upper hard mask pattern 59 may be omitted.

Figure 11A:
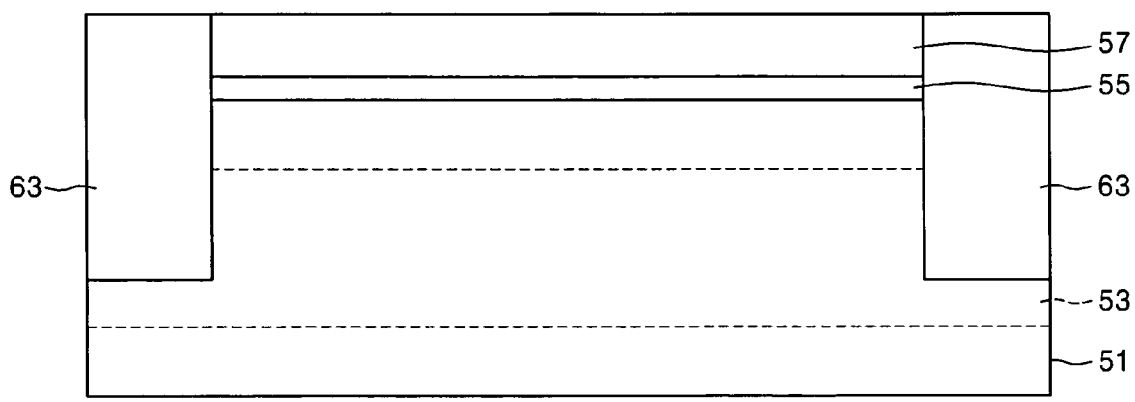
Figure 11B:
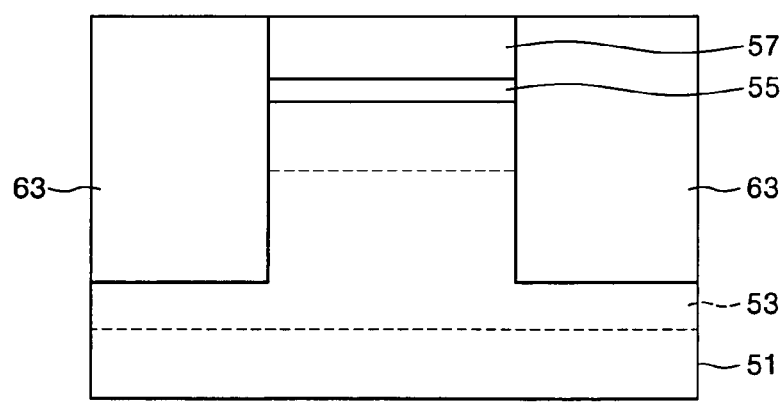

Referring to FIGS. 11A and 11B, an insulating layer is formed to fill the trench 61. The insulating layer may comprise a silicon oxide layer. The insulating layer is planarized until the upper surface of the lower hard mask pattern 57 is exposed to form an isolation layer 63. In the other embodiments of the present invention, as described with reference to FIGS. 4A and 4B, the process of recessing the lower hard mask pattern 57 using the isotropic etching technique may be omitted.

Figure 12A:
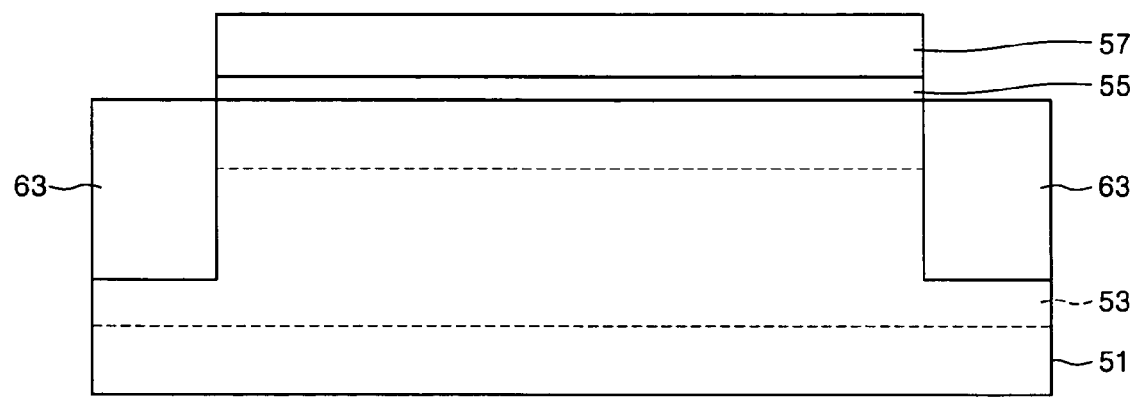
Figure 12B:
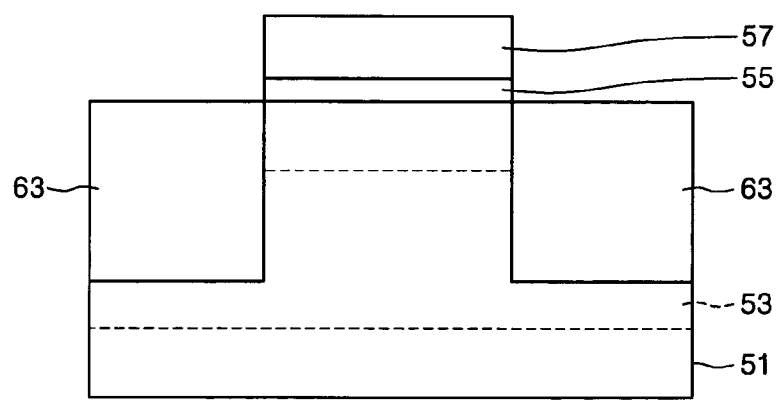

Referring to FIGS. 12A and 12B, the isolation layer 63 is recessed to almost the same level as the upper surface of the semiconductor substrate 51. In this case, an active region of the semiconductor substrate 51 is prevented from being exposed by the lower hard mask pattern 57 and the pad oxide layer 55. The process of recessing the isolation layer 63 may be omitted.

Figure 13A:
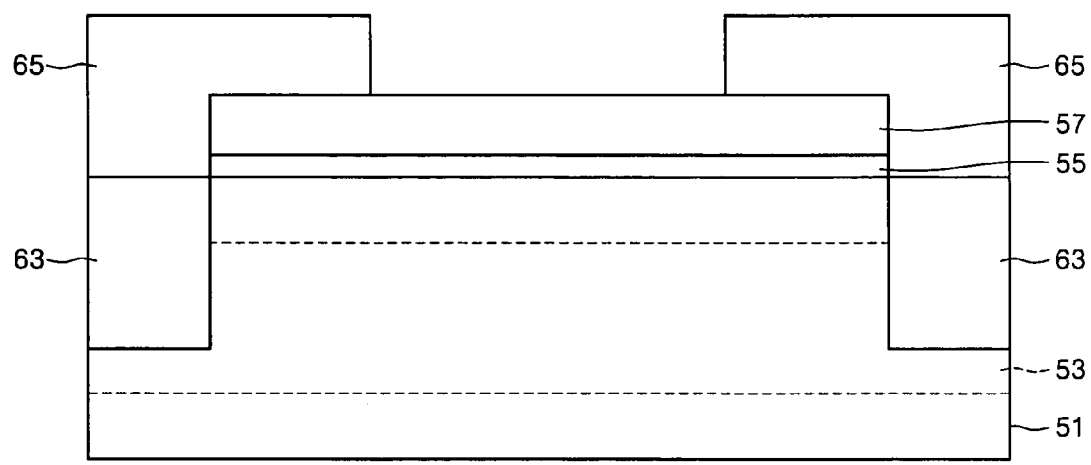
Figure 13B:
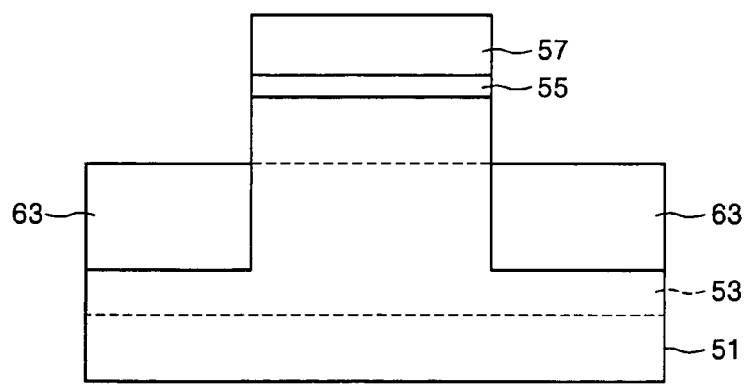

Referring to FIGS. 13A and 13B, a photoresist layer is formed on the semiconductor substrate 51 having the recessed isolation layer 63. The photoresist layer is then patterned to form a photoresist pattern 65 having a groove extending across the upper surface of the lower hard mask pattern 57. In this case, the isolation layer 63 adjacent to the lower hard mask pattern 57 is exposed through the groove.

The exposed isolation layer 63 is recessed by etching using the photoresist pattern 65 and the lower hard mask pattern 57 as an etching mask. In this case, the exposed isolation layer 63 is recessed to almost the same level as the channel stopping region 53. As a result, sidewalls of the active region are exposed as shown in FIG. 13B.

Figure 14A:
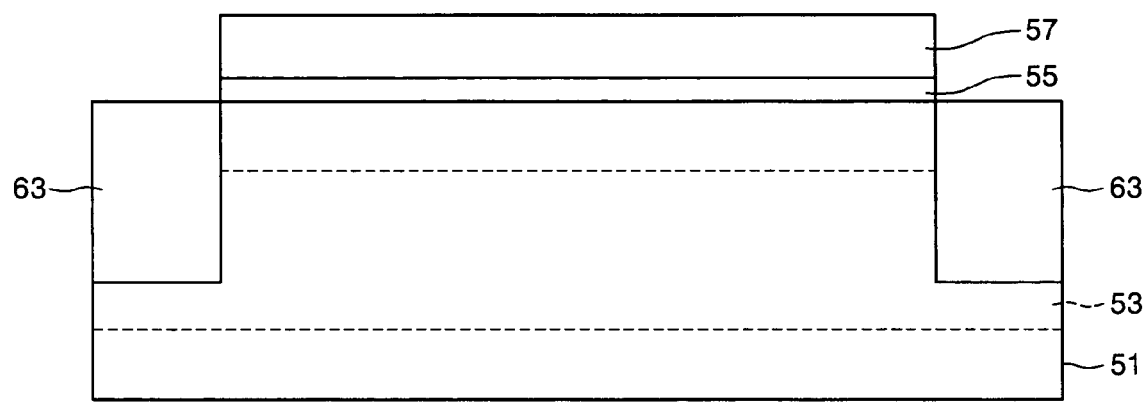
Figure 14B:
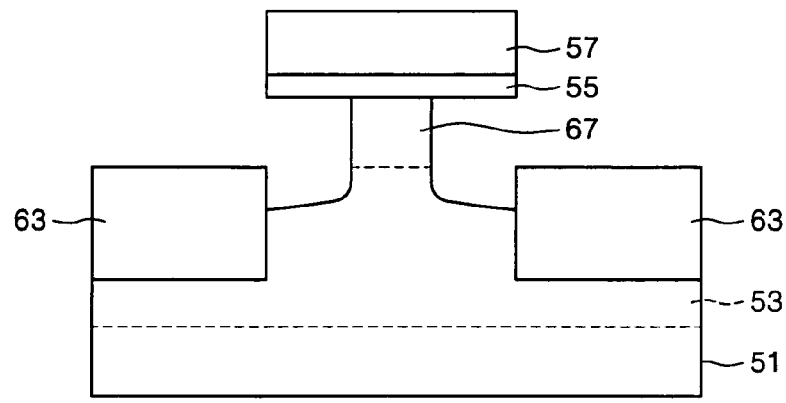

Referring to FIGS. 14A and 14B, after the sidewalls of the active region are exposed, the photoresist pattern 65 is removed. The semiconductor substrate 51 is then etched, using an isotropic etching technique, e.g., a wet etching technique, to recess the sidewalls of the exposed active region. Accordingly, the sidewalls of the exposed active region are recessed to form a fin 67. Some portion of the channel stopping region 53 may be recessed together with the semiconductor substrate 51.

Figure 15A:
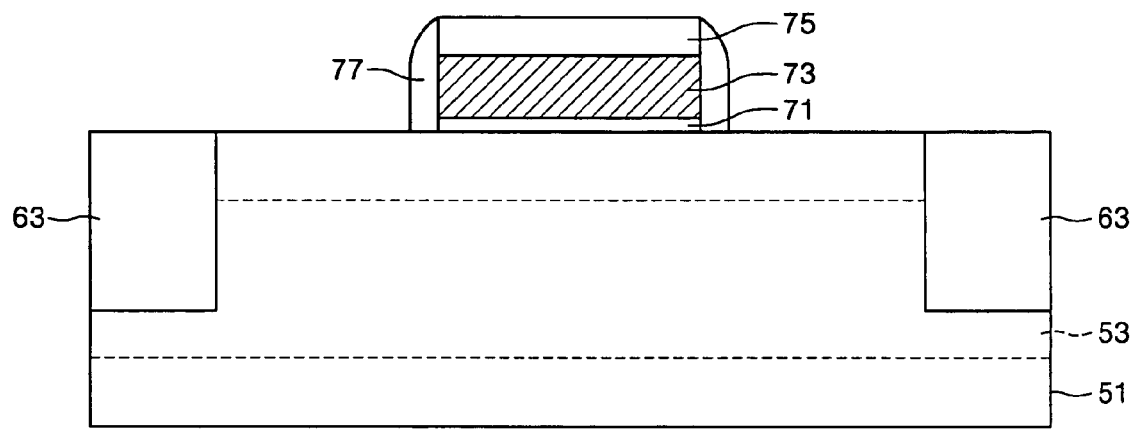
Figure 15B:
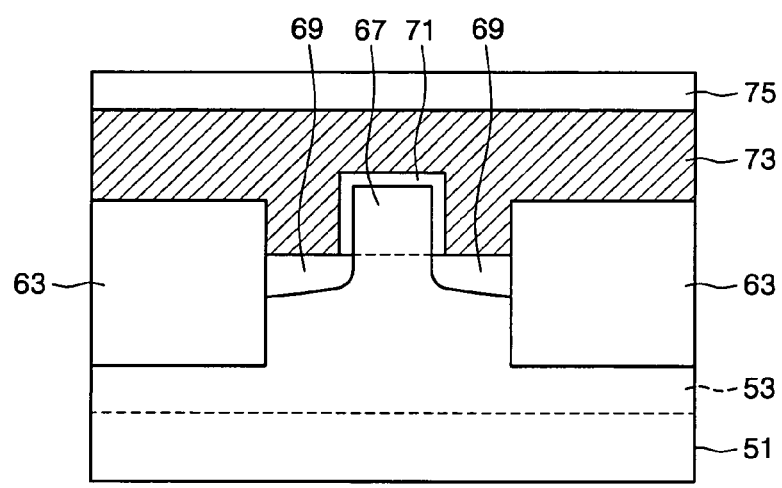

Referring to FIGS. 15A and 15B, after the fin 67 is formed, the lower hard mask pattern 57 and the pad oxide layer 55 are removed. As a result, the upper surface of the fin 67 is exposed. As described with reference to FIGS. 9A and 9B, a gate insulating layer 71 is then formed on the upper surface and sidewalls of the fin 67.

A channel stopping layer 69 may be formed on the channel stopping region 53 between the fin 67 and the isolation layer 63 before forming the gate insulating layer 71. A gate conductive layer and a gate hard mask layer are formed on the semiconductor substrate having the gate insulating layer 71. The gate conductive layer and the gate hard mask layer are then patterned to form a gate hard mask pattern 75 and a gate electrode 73. The gate electrode 73 covers the sidewalls of the fin 67.

As described with reference to FIGS. 9A and 9B, impurity ions are implanted using the gate hard mask pattern 75, as an ion implantation mask, to form source and drain regions 69. An interlayer insulating layer (not shown) may be formed on the semiconductor substrate 51 having the source and drain regions 69, and source and drain contacts (not shown) may be formed which penetrate the interlayer insulating layer and electrically contact the source and drain regions 79.

According to another embodiments of the present invention, a process of recessing the lower hard mask pattern 75 may be omitted, so that a process of fabricating the FinFET can be simplified.

In accordance with the present invention, the fin may be readily formed which has a difficulty in its formation using the photolithography-etching technique, so that a method of fabricating the highly integrated FinFETs may be provided, preventing a short channel effect.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a fin field effect transistor (FinFET), the method comprising:

forming a hard mask pattern having a lower hard mask pattern and an upper hard mask pattern on a semiconductor substrate;

etching the semiconductor substrate, using the hard mask pattern as an etching mask, to form a trench therein, the trench defining an active region;

recessing sidewalls of the lower hard mask pattern;

forming an isolation layer that fills the trench and covers sidewalls of the recessed lower hard mask pattern and exposing an upper surface of the recessed lower hard mask pattern;

etching a predetermined region of the active region, using the recessed lower hard mask pattern as an etching mask, to form a fin;

removing the lower hard mask pattern to expose an upper surface of the fin; and forming a gate electrode that covers the exposed upper surface and sidewalls of the fin, wherein the gate electrode is insulated from the fin.

2. The method as recited in claim 1, further comprising forming a channel stopping region by implanting channel ions onto the semiconductor substrate, before forming the hard mask pattern.

3. The method as recited in claim 1, wherein forming the isolation layer and exposing the upper surface of the recessed lower hard mask pattern includes:

forming an insulating layer on the semiconductor substrate having the recessed lower hard mask pattern; and planarizing the insulating layer until the upper surface of the recessed lower hard mask pattern is exposed.

4. The method as recited in claim 3, further comprising:

forming a photoresist pattern having a groove extending across the recessed lower hard mask pattern, on the semiconductor substrate having the isolation layer, before etching the predetermined region of the active region; and removing the photoresist pattern, after etching the predetermined region of the active region.

5. The method as recited in claim 3, further comprising selectively recessing the isolation layer to expose the upper surface of the active region after forming the isolation layer.

6. The method as recited in claim 5, further comprising:

forming a photoresist pattern having a groove extending across the recessed lower hard mask pattern and the active region, on the semiconductor substrate having the recessed isolation layer, before etching the predetermined region of the active region; and removing the photoresist pattern after etching the predetermined region of the active region.

7. The method as recited in claim 1, wherein forming the gate electrode includes:

forming a gate insulating layer that covers the upper surface and sidewalls of the fin;

forming a gate conductive layer and a gate hard mask layer overlying the gate insulating layer; and sequentially patterning the gate hard mask layer and the gate conductive layer.

8. The method as recited in claim 7, further comprising forming source and drain regions, after forming the gate electrode.

9. The method as recited in claim 1, further comprising forming a channel stopping layer on the etched active region.

10. The method as recited in claim 9, wherein forming the isolation layer and exposing the upper surface of the recessed lower hard mask pattern includes:

forming an insulating layer on the semiconductor substrate having the recessed lower hard mask pattern; and
planarizing the insulating layer until the upper surface of the recessed lower hard mask pattern is exposed.

11. The method as recited in claim 10, further comprising:
forming a photoresist pattern having a groove extending across the recessed lower hard mask pattern, on the semiconductor substrate having the isolation layer, before etching the predetermined region of the active region; and
removing the photoresist pattern, after etching the predetermined region of the active region.

* * * * *